(12) United States Patent
Ren et al.

(10) Patent No.: US 8,202,780 B2
(45) Date of Patent: Jun. 19, 2012

(54) METHOD FOR MANUFACTURING A FINFET DEVICE COMPRISING A MASK TO DEFINE A GATE PERIMETER AND ANOTHER MASK TO DEFINE FIN REGIONS

(75) Inventors: Zhibin Ren, Hopewell Junction, NY (US); Xinhui Wang, Hopewell Junction, NY (US); Kevin K. Chan, Hopewell Junction, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 12/533,389

(22) Filed: Jul. 31, 2009

(65) Prior Publication Data

US 2011/0027948 A1 Feb. 3, 2011

(51) Int. Cl.
*H01L 21/336* (2006.01)
(52) U.S. Cl. ........ 438/270; 438/156; 438/212; 438/268; 257/329; 257/E21.41
(58) Field of Classification Search ........................ None
See application file for complete search history.

(56) References Cited

U.S. PATENT DOCUMENTS

| | | | |
|---|---|---|---|
| 6,252,284 B1 | 6/2001 | Muller et al. | |
| 6,413,802 B1 | 7/2002 | Hu et al. | |
| 6,642,090 B1 | 11/2003 | Fried et al. | |
| 6,815,268 B1 | 11/2004 | Yu et al. | |
| 6,835,609 B1 | 12/2004 | Lee et al. | |
| 7,041,542 B2 | 5/2006 | Ahmed et al. | |
| 7,153,784 B2 | 12/2006 | Brask et al. | |
| 7,315,994 B2 | 1/2008 | Aller et al. | |
| 7,348,642 B2 | 3/2008 | Nowak | |
| 7,358,142 B2 | 4/2008 | Kang et al. | |
| 7,488,654 B2 | 2/2009 | Kim et al. | |
| 7,528,025 B2 | 5/2009 | Brask et al. | |
| 2005/0145941 A1 | 7/2005 | Bedell et al. | |
| 2005/0153492 A1* | 7/2005 | Ahmed et al. | 438/183 |
| 2006/0175669 A1 | 8/2006 | Kim et al. | |

(Continued)

OTHER PUBLICATIONS

Hisamoto, et al. A Fully Depleted Lean-channel Transistor (DELTA) IEDM 89-833-1989 IEEE—pp. 833-836.

(Continued)

*Primary Examiner* — Evan Pert
*Assistant Examiner* — Andres Munoz
(74) *Attorney, Agent, or Firm* — Catherine Ivers; Joseph P. Abate

(57) ABSTRACT

A method for manufacturing a FinFET device includes: providing a substrate having a mask disposed thereon; covering portions of the mask to define a perimeter of a gate region; removing uncovered portions of the mask to expose the substrate; covering a part of the exposed substrate with another mask to define at least one fin region; forming the at least one fin and the gate region through both masks and the substrate, the gate region having side walls; disposing insulating layers around the at least one fin and onto the side walls; disposing a conductive material into the gate region and onto the insulating layers to form a gate electrode, and then forming source and drain regions.

19 Claims, 18 Drawing Sheets

U.S. PATENT DOCUMENTS

2006/0189043 A1* 8/2006 Schulz .................. 438/142
2007/0254435 A1 11/2007 Orlowski
2008/0042202 A1 2/2008 Ieong et al.
2008/0283917 A1 11/2008 Cheng et al.
2008/0299734 A1 12/2008 Lee et al.
2009/0078997 A1 3/2009 Greene et al.

OTHER PUBLICATIONS

VLSI Technology, by S.M. Szxe, Second Edition, McGraw Hill Publishing Company, 1988 pp. 397, 504.

* cited by examiner

METHOD FOR MANUFACTURING A FINFET DEVICE COMPRISING A MASK TO DEFINE A GATE PERIMETER AND ANOTHER MASK TO DEFINE FIN REGIONS

BACKGROUND OF THE INVENTION

Technical Field

The present invention relates generally to the field of semiconductor device manufacturing and, more specifically, to a methods for manufacturing fin field effect transistors (FinFETs) and FinFET devices.

The need to remain cost and performance competitive in the production of semiconductor devices has driven the increase in device density in integrated circuits. To facilitate the increase in device density, new technologies are constantly needed to allow the feature size of these semiconductor devices to be reduced.

The push for ever increasing device densities is particularly strong in CMOS technologies such as the in the design and fabrication of field effect transistors (FETs). FETs comprise the dominant components of CMOS. Scaling FETs to attain higher device density in CMOS results in degradation of performance and/or reliability.

One type of FET that has been proposed to facilitate increased device density is a Fin Field Effect Transistor. In FinFETs, the body of the transistor is formed from a vertical structure, generally referred to as a "fin". The gate of the FinFET is then formed on one or more sides of the fin. FinFETs have several advantages, including better current control without requiring increased device size. Thus, FinFETs facilitate scaling of CMOS dimensions while maintaining an acceptable performance.

In fin transistors there is a general need to isolate electrically each FinFET device electrically. Specifically, FinFET devices must be isolated from each other and the source and drain of individual devices must be isolated to ensure source to drain decoupling. For this reason, FinFETs are typically manufactured from silicon-on-insulator (SOI) wafers to provide isolation between the fins of different devices. Specifically, the fins of the transistors are formed from the silicon layer above the buried isolation layer, and each fin is thus isolated from other fins by virtue of the buried isolation layer beneath the fins. Likewise, the source and drains of individual FinFETs are decoupled from each other by the buried isolation layer.

FinFETs can also be manufactured using bulk wafers. A method of isolating devices on bulk wafers is described, for example, by Hisamoto et al, "A fully Depleted Lean—channel Transistor, A novel vertical ultra thin SOI MOSFET", *International Electron Devices Meeting* 1989, Paper 34.5.1, pp 833-6. This method requires that a nitride spacer be built on the fin so that the fin is protected during the oxidation of the underlying substrate to form the region of isolation. Thus, the substrate is selectively oxidized with respect to the fin.

In many typical processes for manufacturing FinFETs, the present inventors believe a step for forming a fin region is performed before any step for forming a gate region. See, for example, U.S. Pat. No. 7,041,542 B2, Damascene Tri-Gate FinFET, filed Jan. 12, 2004, issued May 9, 2006, by Ahmed et al., which is hereby incorporated in its entirety by reference herein.

In these many typical processes, the present inventors believe that the gates are not "self-aligned" with the sources and drains. In other words, during the manufacturing process, the source and drain regions are not formed with approximately ($\pm 10\%$) equal distances from the gate, without assistance of other precision control techniques. Self-alignment generally avoids asymmetric geometries of the source and drain, and thus helps to decrease undesired performance of the FinFET device.

For a further discussion of benefits in general of "self-alignment", see, for example, the text in *VLSI Technology*, by S. M. SZE, pages 397, 504, (second edition, McGraw Hill Publishing Company, 1988).

For various known processes for manufacturing FinFETs and FinFET devices, see for example: U.S. Pat. No. 7,488,654 B2, "Fabrication Of Local Damascene FinFETs Using Contact Type Nitride Damascene Mask," filed Aug. 24, 2006, issued Feb. 10, 2009, by Kim et al; U.S. Pat. No. 6,413,802 B1, "FinFET Transistor Structures Having A Double Gate Channel Extending Vertically From A Substrate And Methods Of Manufacture," filed Oct. 23, 2000, issued Jul. 2, 2002, by Hu et al.

The present inventors believe further improvements in manufacturing FinFETs are achievable.

SUMMARY OF THE INVENTION

According to a preferred embodiment of the present invention for manufacturing a FinFET device, a perimeter of a gate region is defined prior to defining a fin region, and the source and drains are formed after forming the gate electrode.

According to another preferred embodiment, a conductive material disposed in the gate region is planarized by means of a chemical mechanical planarization (CMP) process.

Advantages of preferred embodiments of the present invention include, for example, the source and drains being "self-aligned" with the gate electrode.

Further advantages include better control for planarizing the gate by means of CMP, rather than, for example, an etch process. Hard mask metal etch process in a non-planar structure such as a FinFET is believed by the present inventors to be more challenging than use of CMP.

It is a principal object of the present invention to provide an improved process for manufacturing FinFET devices that is readily integrated into existing CMOS manufacturing processes.

The present inventors believe these advantages and objects are achieved in a method for manufacturing a FinFET including: providing a substrate having a mask disposed thereon; covering portions of the mask to define a perimeter of a gate region; removing uncovered portions of the mask to expose the substrate; covering a part of the exposed substrate with another mask to define at least one fin region; forming the gate region and the at least one fin through both masks and the substrate, the gate region having side walls; disposing insulating layers around the at least one fine and onto the side walls; disposing a conductive material into the gate region and onto the insulating layers to form a gate electrode, and then forming source and drain regions. Substrates may be silicon-on-insulator substrates, or bulk substrates such as silicon or even silicon germanium.

BRIEF DESCRIPTION OF THE DRAWINGS

The present invention is best understood from the following detailed description when read in connection with the accompanying drawing. It is emphasized that, according to common practice, the various features of the drawing are not to scale. On the contrary, the dimensions of various features are arbitrarily expanded or reduced for clarity. Included in the drawing are the following figures.

DETAILED DESCRIPTION OF A PREFERRED EMBODIMENT AND BEST MODE

Figure 1A:
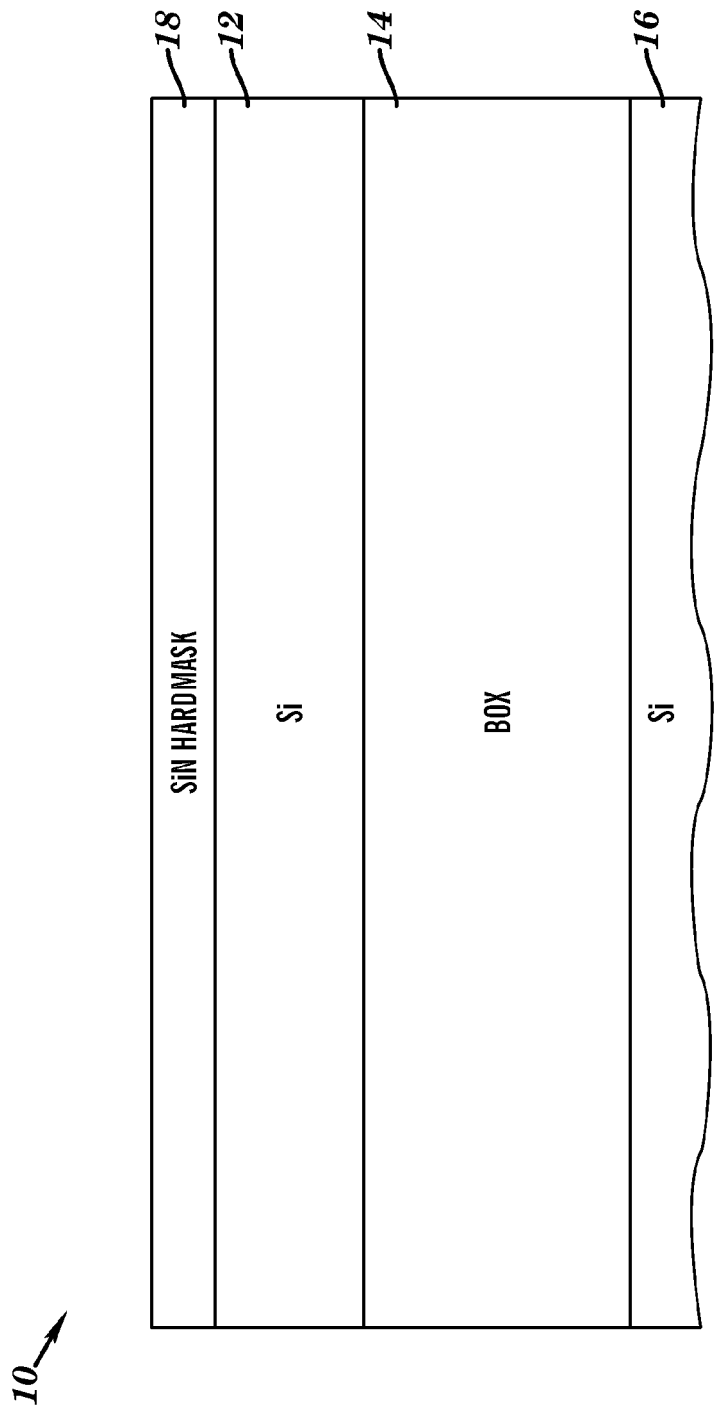
FIGS. 1A-1O show various top and side schematic views, several in cross-section, for a preferred embodiment of a method according to the present invention.

Referring now to the figures and FIG. 1A in particular, there is shown an initial structure, such as a silicon-on-insulator substrate space 10. The structure 10 includes a silicon layer or substrate 12 disposed on an insulator layer (BOX) 14 that is disposed on a silicon substrate 16. A conventional hard mask 18 is disposed on (e.g. covers) the substrate 12.

The substrate 14 has an approximately (±10%) uniform thickness of preferably from about (±10%) 1000 Å to about 5000 Å, and more preferably from about 2000 Å to 4000 Å. The layer 12 has an approximately uniform thickness of preferably from about 300 Å to 2000 Å, and more preferably from about 500 Å to about 1500 Å. The silicon substrate 16 has a conventional thickness for use in an SOI substrate 10.

A hard mask 18 is provided on the layer 12 by conventional techniques. Preferably, the hard mask comprises, for example, oxide, silicon oxide, nitride, silicon nitride (SiN) or a combination of oxide/silicon oxide and nitride/silicon nitride. The hard mask 18 has an approximately uniform thickness in a range of, about 5 nm to about 50 nm.

Figure 1B:
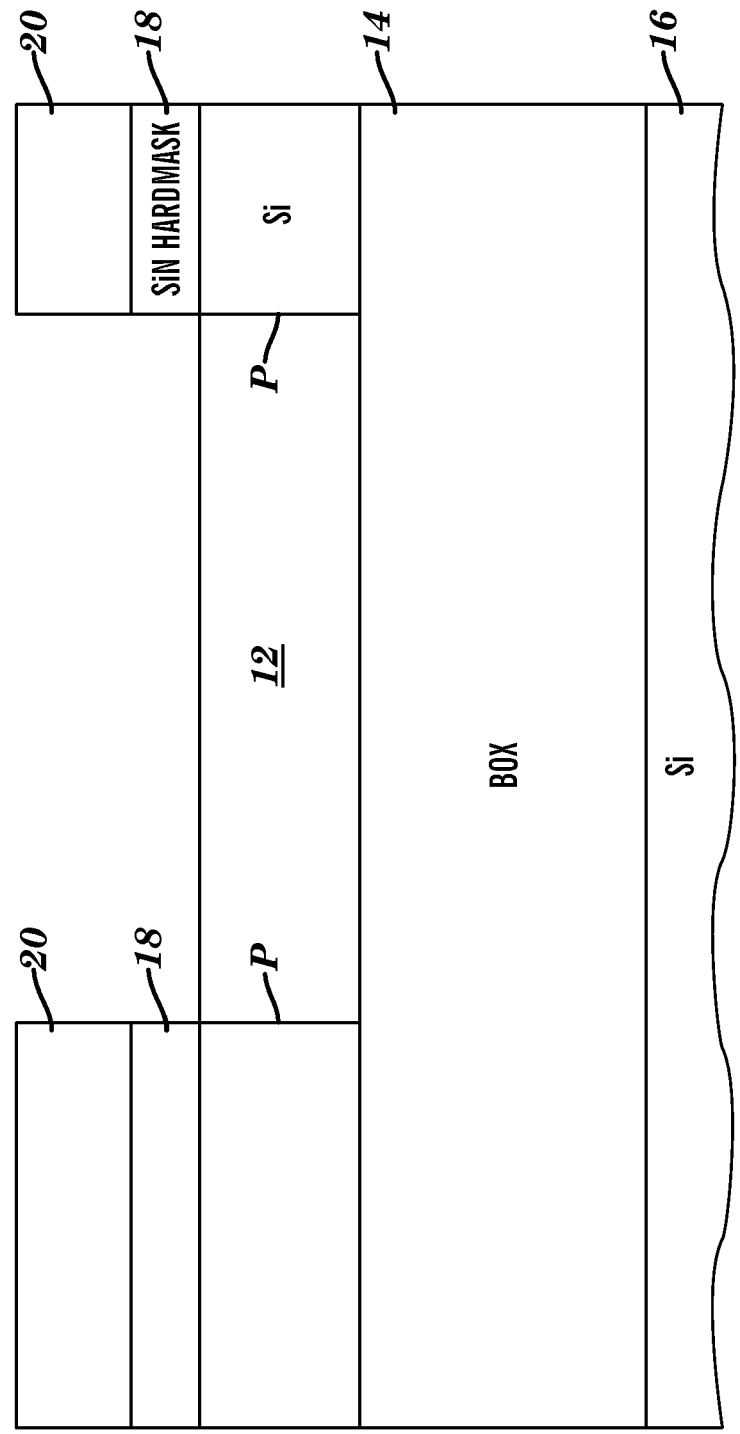

As shown in FIG. 1B, portions 18 of the hardmask 18 are covered with a photoresist mask material 20 to define a perimeter P (shown as dashed lines) of a gate region.

Next, remove uncovered (by the mask material 20) portions of the SiN hardmask 18 to expose the silicon 12 on the insulator 14. Removal is accomplished, for example, by a suitably conventional reactive ion etch process (RIE) ending on the Si 12 which need not be further described. The photoresist 20 is then conventionally removed by any suitable etch (e.g., wet etch).

Figure 1C:
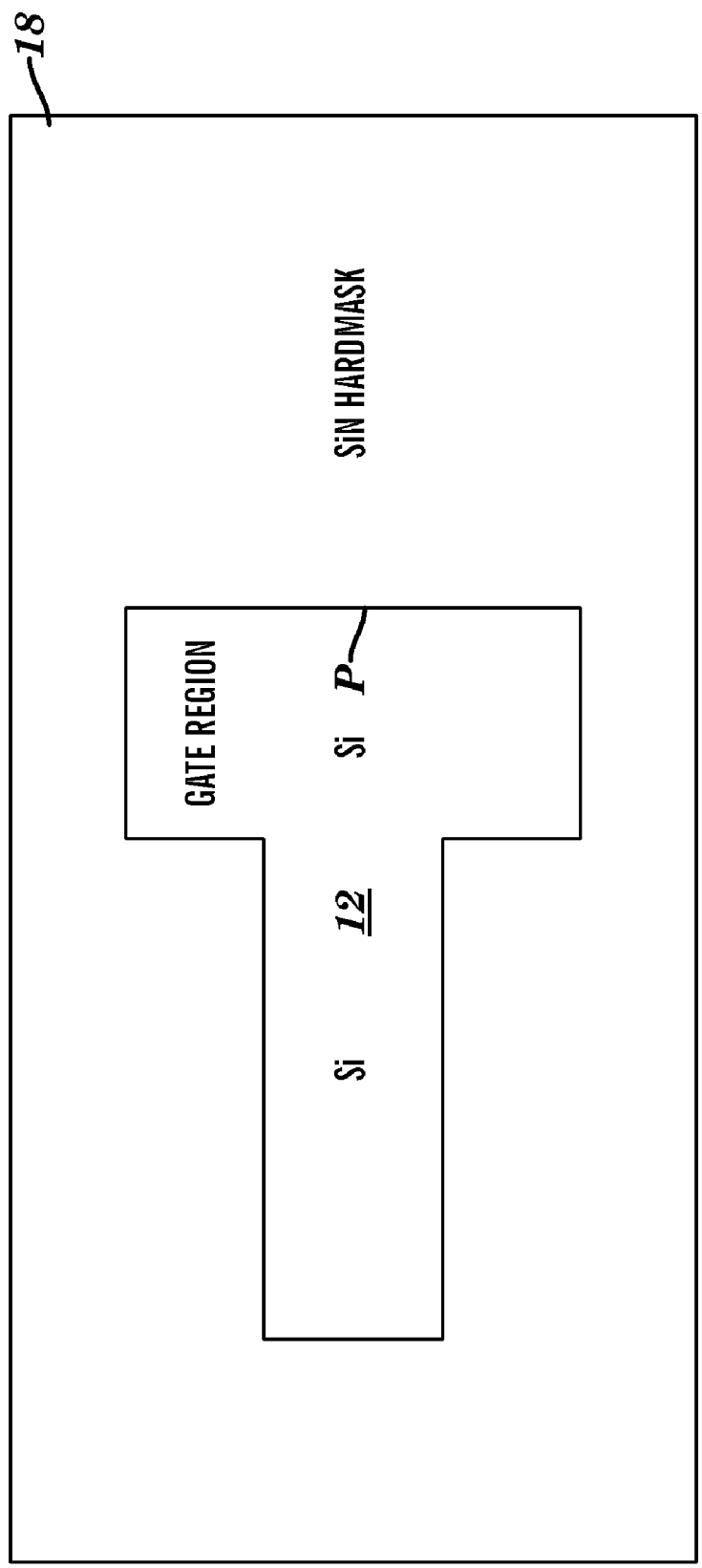

FIG. 1C is a top planar view of the structure resulting after performing the steps of FIG. 1B. FIG. 1C shows the perimeter P of the gate region exposing the Si layer 12. FIG. 1C also shows that the gate region preferably has a T-shaped perimeter.

Figure 1D:
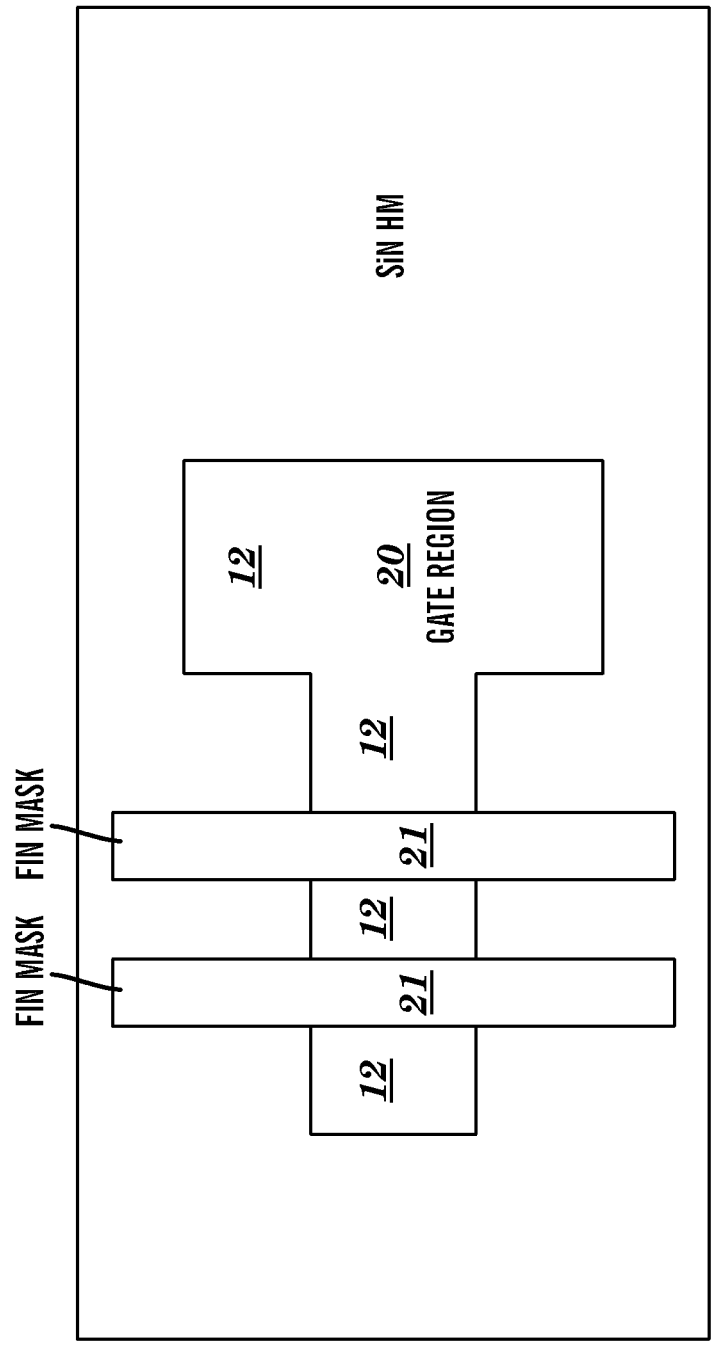
Figure 1E:
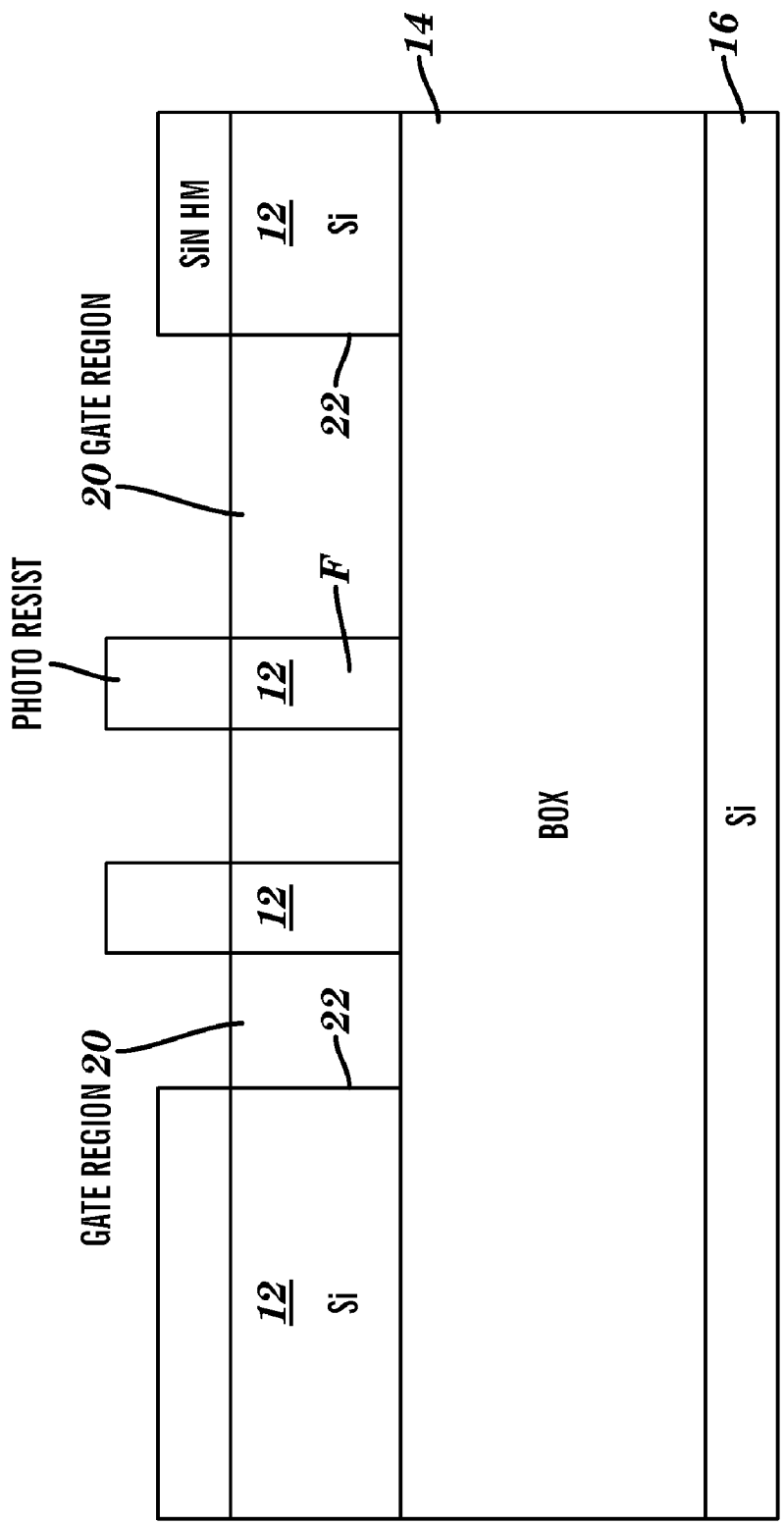
Figure 1F:
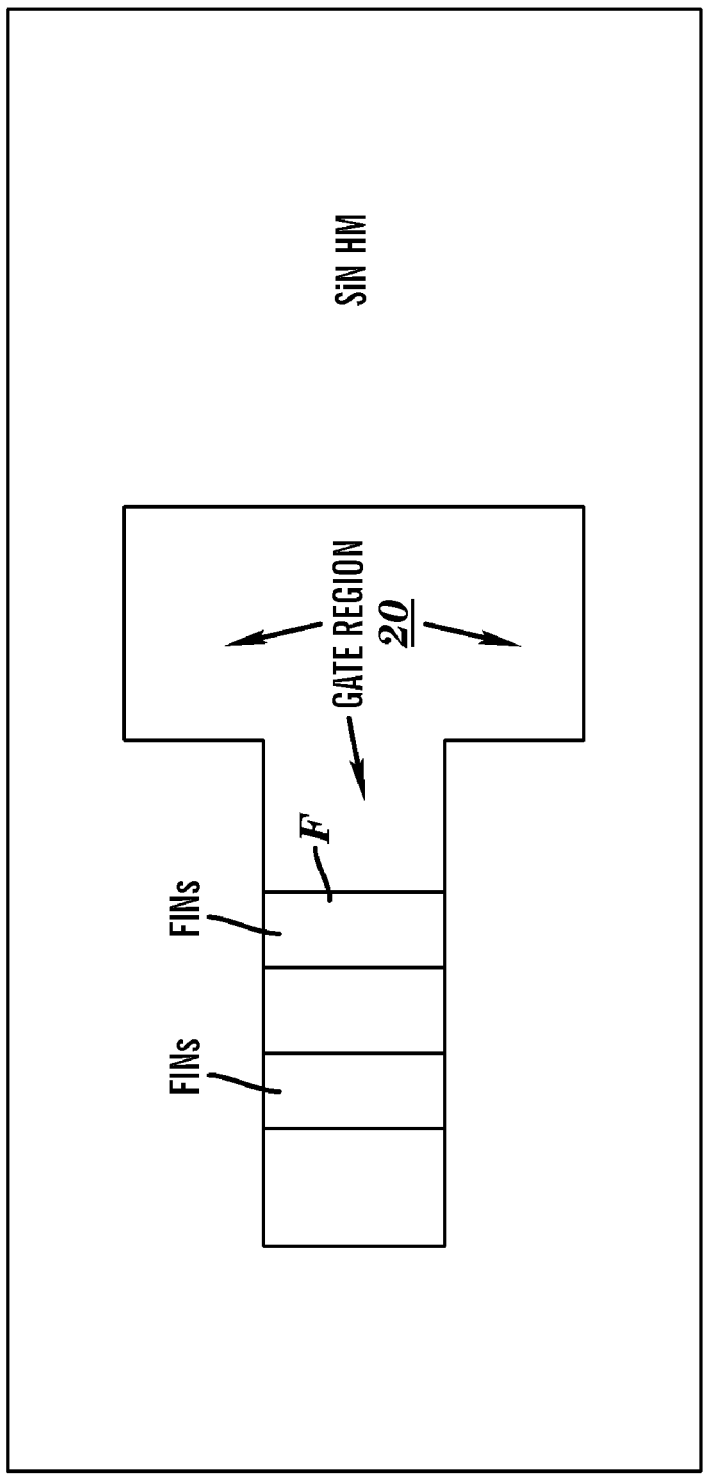

In FIG. 1D, cover part of the silicon 12 with a photoresist mask material 21 to define at least one fin region under the material 21 and in the silicon 12 disposed in the gate region 20. In this embodiment, two fin regions are shown in FIGS. 1D, 1E, 1F, 1H, 1K, 2A and 2B. Then, a selective RIE is used to remove the Si 12 ending on the BOX layer 14, as shown in FIG. 1E. Thus, in step 1D, 1E and as shown in the top view of FIG. 1F, there is formed the gate region 20 and the at least one fin F through the silicon 12 to the insulator 14. The gate region 20 has side walls 22 as shown.

The photoresist material 21 is then removed by any conventional process such as a suitable wet etch. Optionally, a sacrificial oxide deposition followed by an oxide strip may be used to heal damages to the Si caused by the RIE. The resulting structure showing the gate region 20 containing the at least one fin F is shown (top planar view) in FIG. 1F.

Figure 1G:
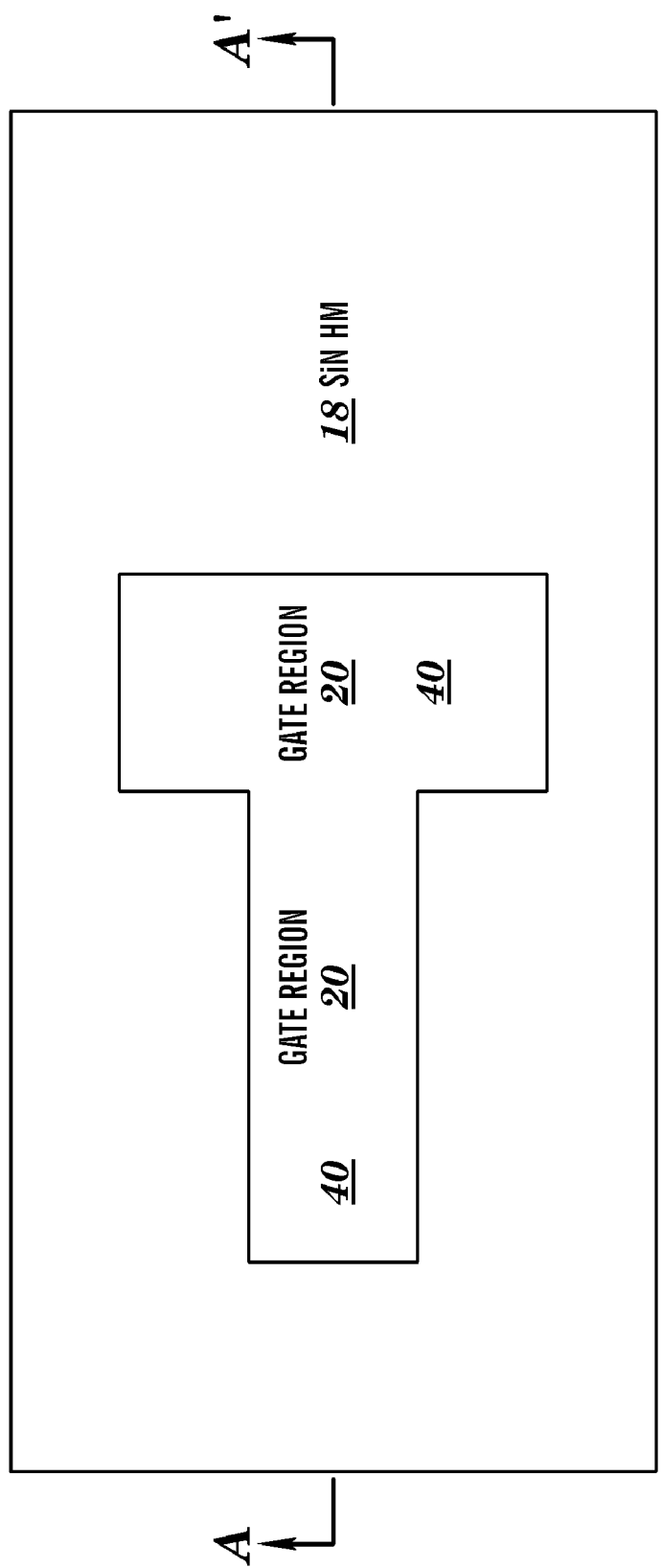
Figure 1H:
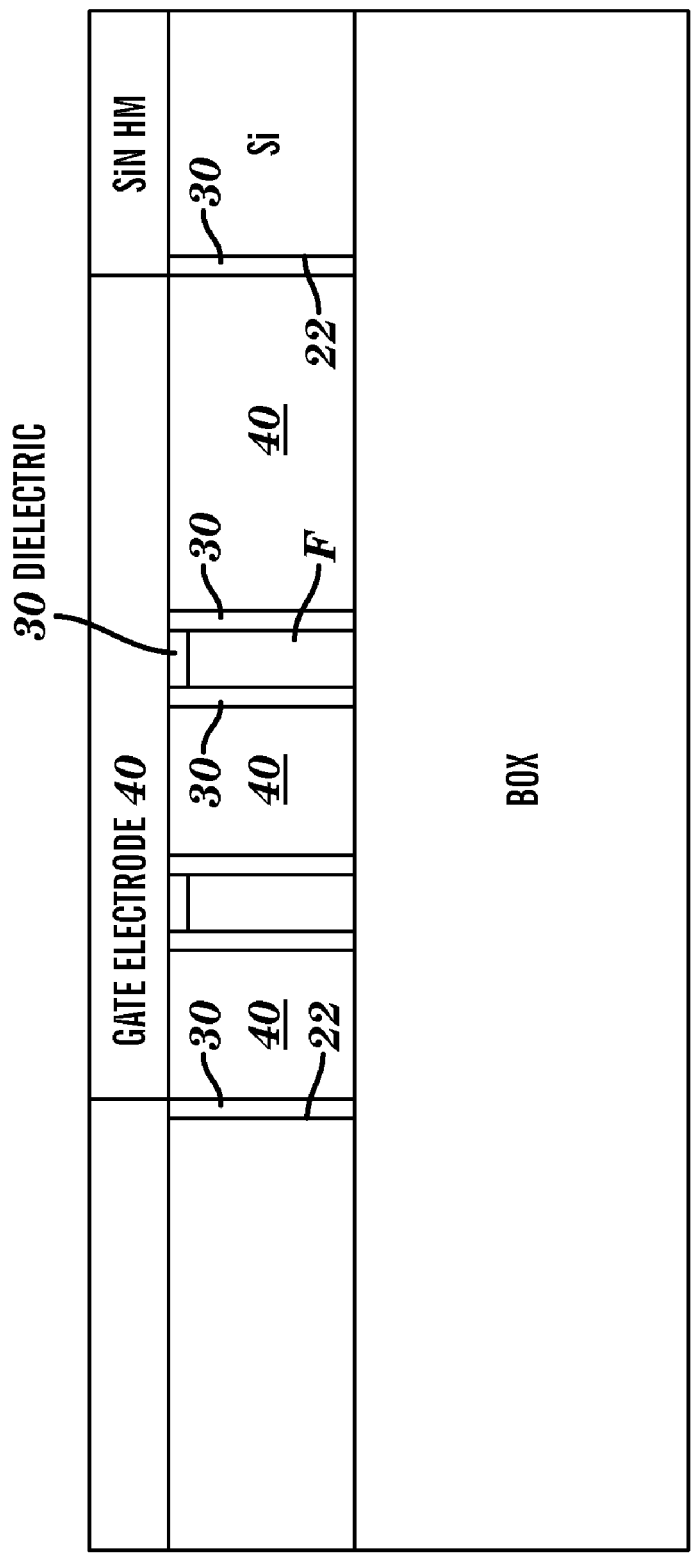

In the next step, FIGS. 1G, 1H, insulator layers 30 are disposed (e.g. thermally grown) on and around the at least one fin F and on the side walls 22. In FIG. 1H, layers 30 are disposed on two fins as shown. Preferably, e.g., the insulating layers 30 are gate oxides suitably and conventionally grown such as $SiO_2$ (silicon dioxide), $Si_3N_4$ (silicon nitride), SiON (silicon oxynitride) or are high-k dielectrics such as HfSiON (nitrided hafnium silicate also referred to as hafnium silicon oxynitride), $HfO_2$ (hafnium oxide), $HfSiO_x$ (hafnium silicate, where 'x' is an integer, preferably 4), $ZrO_2$ (zirconium dioxide), $Al_2O_3$ (aluminum oxide) suitably and conventionally deposited.

The gate region 20 is then filled with a suitable conductive material such as a polysilicon or a suitable metal. Preferred metals include, for example, TiN (titanium nitride), TaN (tantalum nitride).

The metal 40 is disposed into the gate region 20 by any conventional technique, such as CVD, PVD, or ALD. If polysilicon is used to fill the gate region 20, a LPCVD technique can be used.

After filling the gate region 20 with the conductive material 40, the material 40 is planarized preferably by, e.g., CMP stopping on the silicon nitride hard mask 18, followed by an electrode touchup RIE (selective to SiN) step. After the conductive (gate) material 40 is planarized, a structure as shown in the cross-section (viewed normal to line AA' in FIG. 1G) FIG. 1H results.

As shown in the cross-sectional view of FIG. 1H, the gate electrode material 40 fills the gate region 20 and surrounds the surfaces of the dielectric material on the at least one fin F (and the additional fin) and is disposed on the dielectric material 30 present on the sidewalls 22.

Figure 1I:
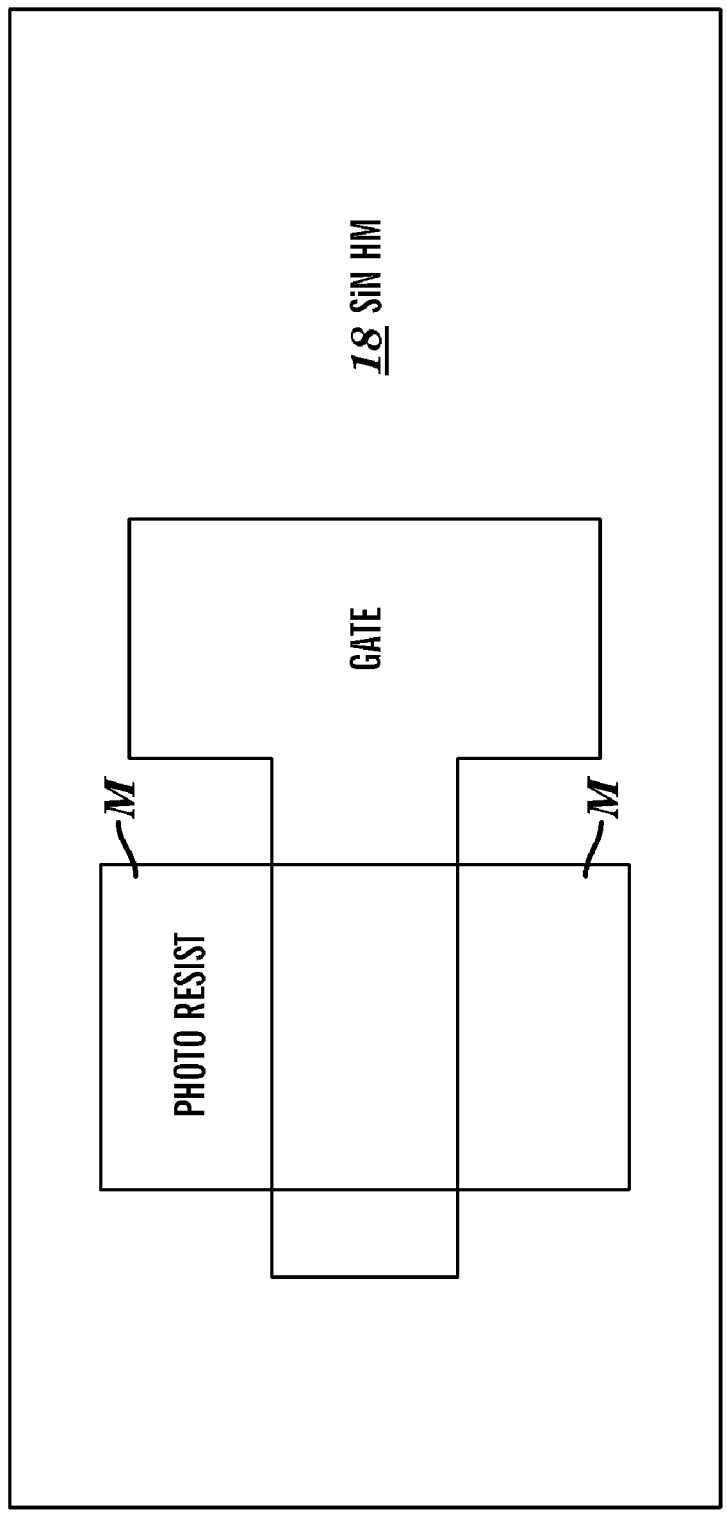

Next, a conventional photoresist (blocking) mask M of any suitable thickness covers parts of the hardmask 18 adjacent to opposite ends of the at least one fin (and the additional fin) and covers a top part of the gate, as shown in FIG. 1I, to define source and drain regions.

Figure 1J:
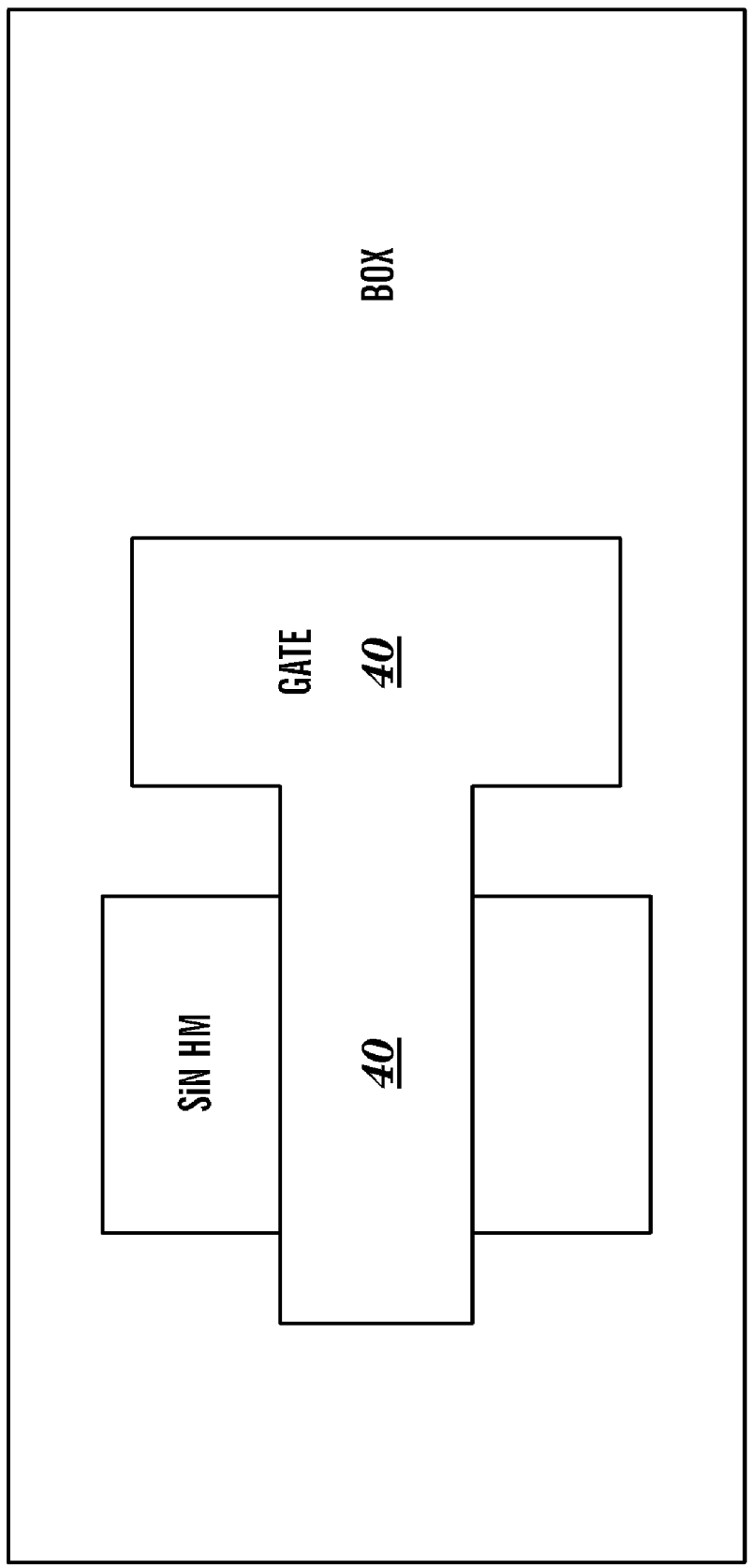

Next, a RIE step is performed to remove portions of the SiN hardmask 18 and the parts of silicon layer 12 not covered by the mask M. A preferred RIE process for this step includes the following preferred parameters and details: Use known F-(SF6, CxFy, CxHyFz, etc.) based plasma with additive gases, such as Ar, He, $O_2$, $N_2$ etc. with different conventional arrangements of rf powers, process pressures, wafer chuck temperatures, and other parameters to selectively etch SiN over gate metal materials, such as TiN, as would be understood by those skilled in the art in view of the instant specification and drawing figures. The RIE should not etch the conductive material of the gate 40. See FIG. 1J. Resist mask M defining the source/drain areas/regions can be stripped by conventional dry or wet or dry/wet combination resist stripping processes, preferably non-oxidized resist processes, such as $N_2/H_2$ based plasmas, as is well known to those skilled in the art. Any remaining parts of the hardmask 18 may be removed by suitable dry etch, to produce an intermediate structure, FIG. 1J, but without the SiN hardmask HM.

Figure 1K:
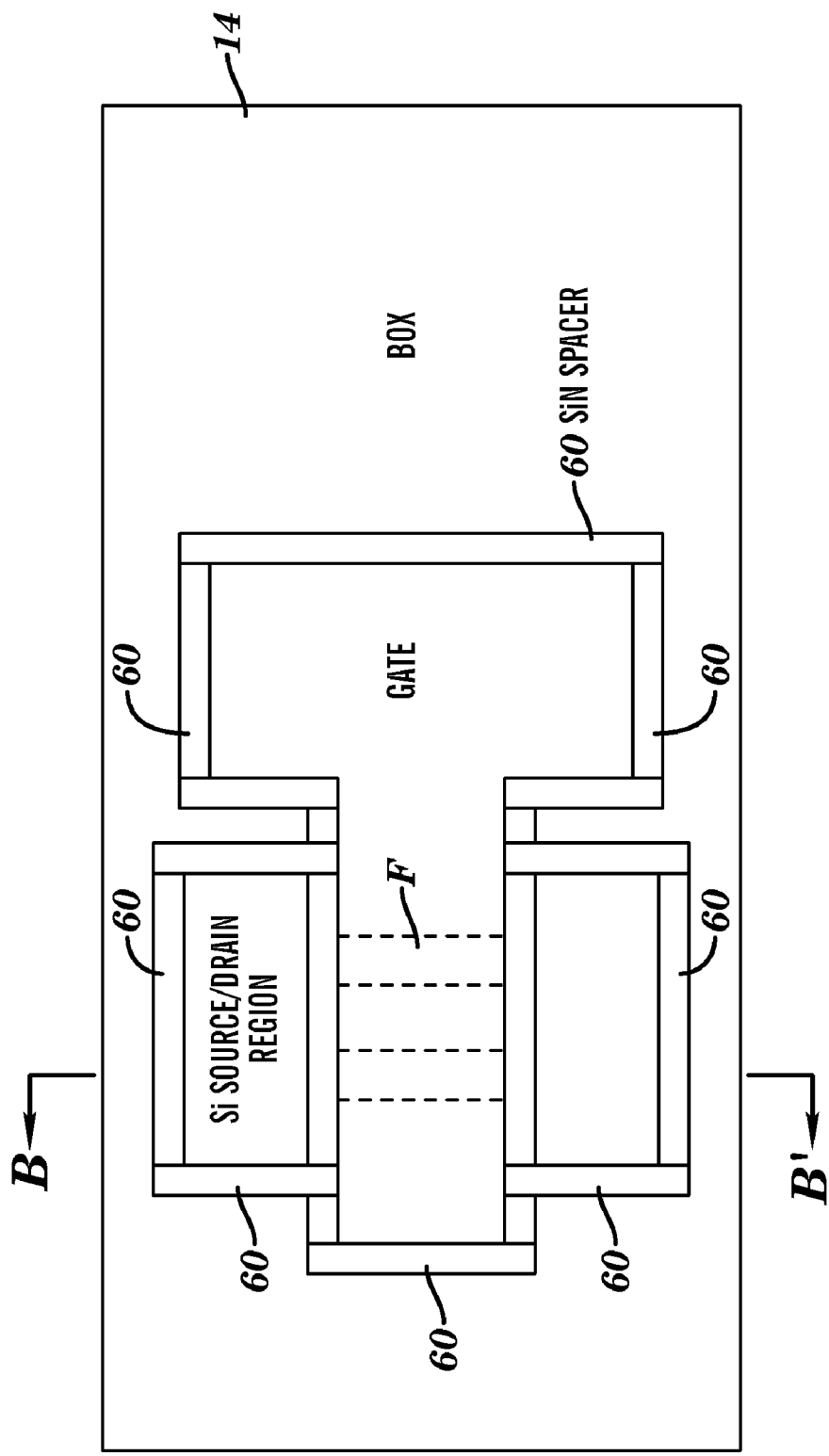

In FIG. 1K, an insulating spacer material 60 is deposited on the intermediate structure and around perimeters of the intermediate structure as shown by conventional techniques. For example, deposit SiN spacer material and then RIE to form the spacers 60, stopping on BOX 14. See cross-sectional FIGS. 1L and 1M. This process for forming SiN spacers 60 is a well known conventional process.

Figure 1L:
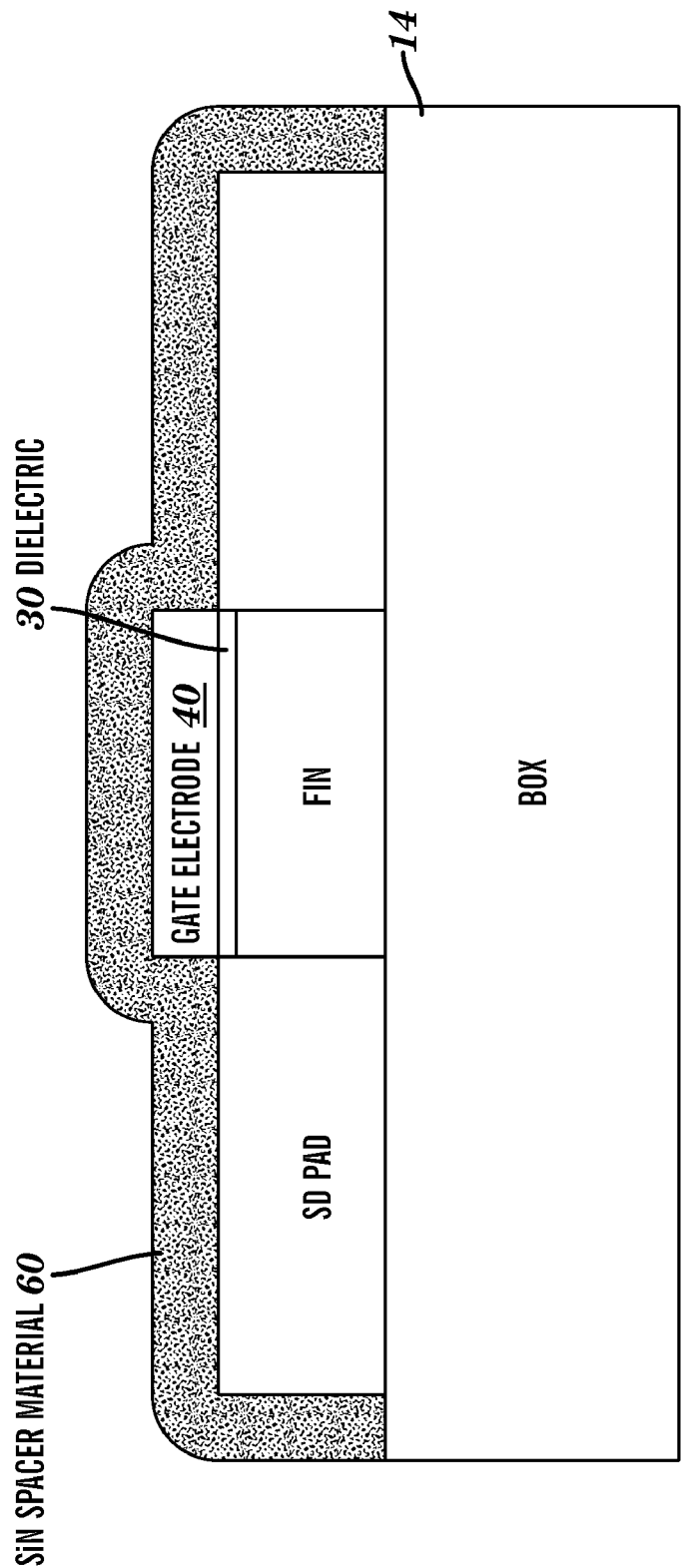
Figure 1M:
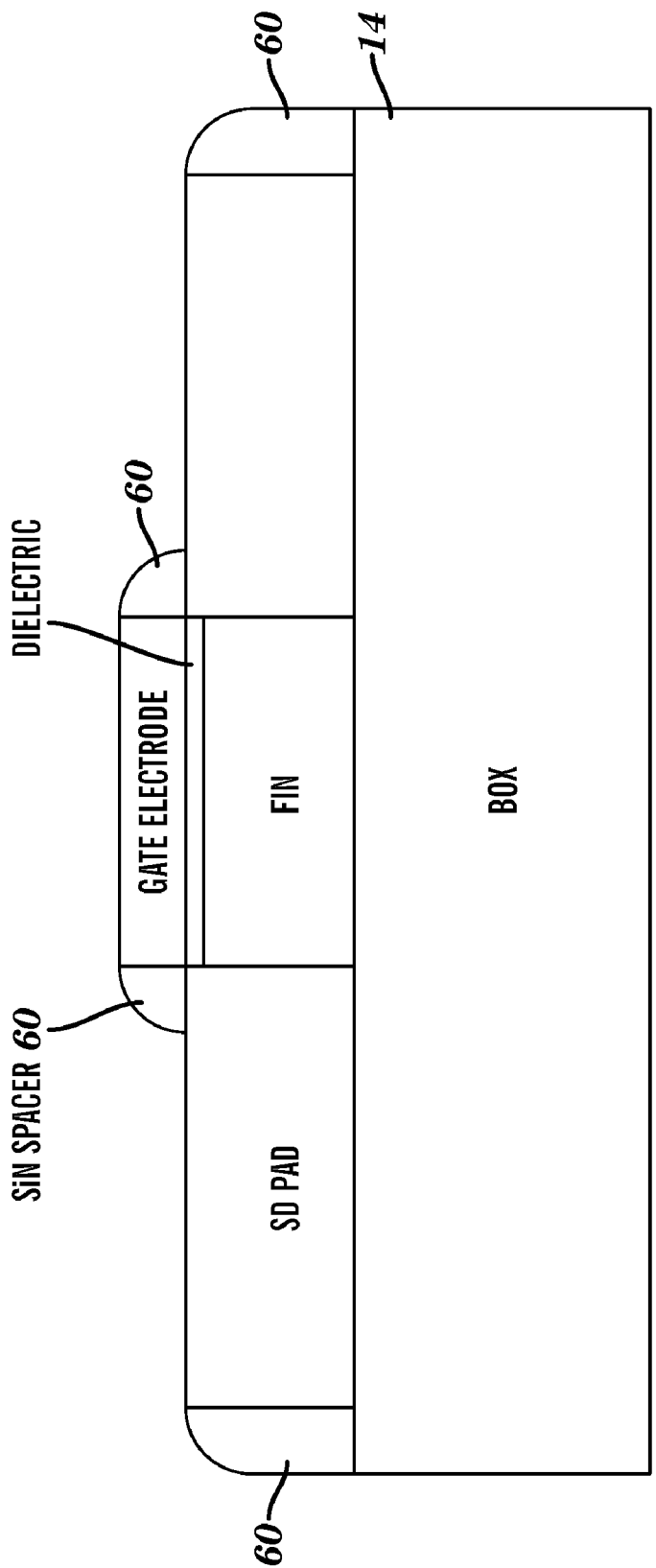

The cross-sectional views of FIGS. 1L and 1M are taken in a direction normal to the arrow BB' of FIG. 1K. FIG. 1K shows schematically the at least one fin F (and the additional fin) beneath the gate electrode 40.

FIG. 1L shows the SiN spacer material 60 deposition, while FIG. 1M shows the SiN space formation using a suitable RIE technique well known.

Next, form source and drains in the source and drain regions using conventional techniques—such as implants and then a suitable anneal.

Figure 1N:
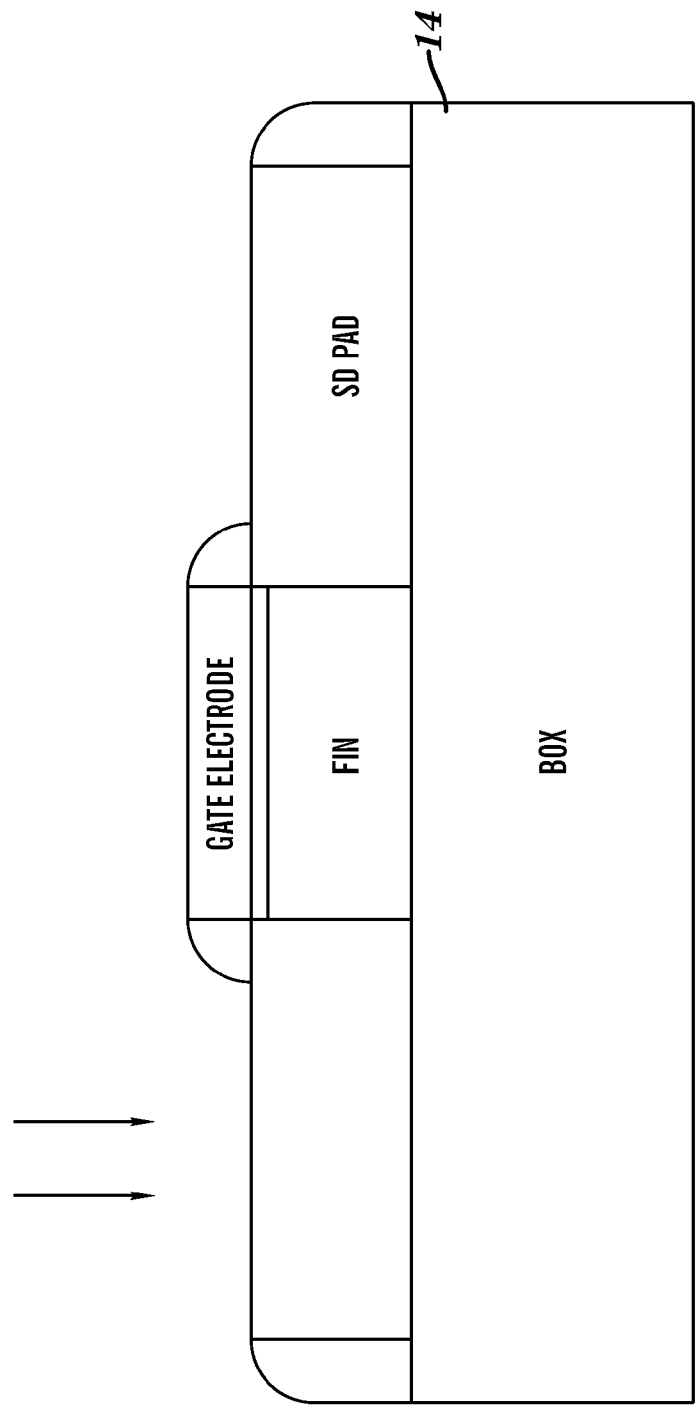
Figure 10:
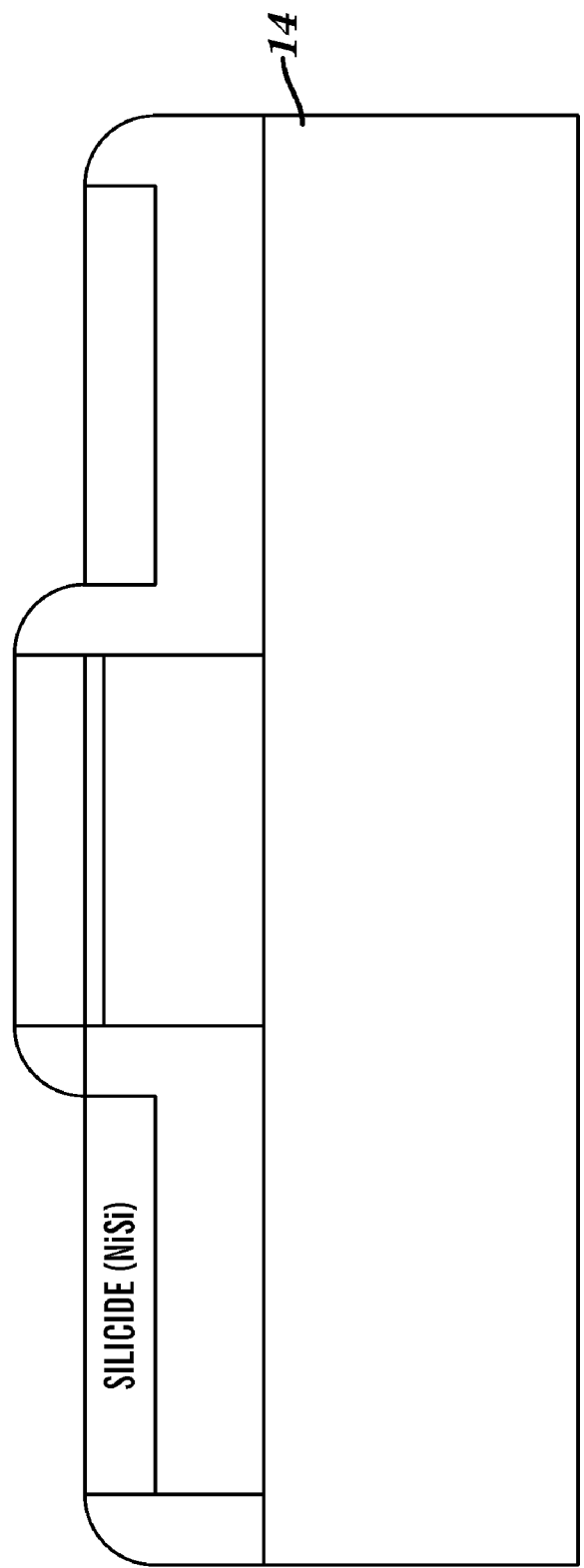

Thus, for NFETs, typically P, As, or Sb, for example, is used for the source/drain implants in the range of 1 to 5 keV and a dose of $5 \times 10^{14}$ to $2 \times 10^{15}$ $cm^{-3}$. Similarly, for PFETs, typically B, In, or Ga for example is used for the source/drain implants in the range of 0.5 to 3 keV and dose of $5 \times 10^{14}$ to $2 \times 10^{15}$ $cm^{-3}$. Alternatively use as: 10-20 keV, $3 \times 10^{15}$ $cm^{-3}$ for NFETs, and BF2: 5-9 keV, $3 \times 10^{15}$ $cm^{-3}$ for FETs. Source/ drain anneal may include 1065° C. spike plus laser anneal of 1250° C., as is known conventionally. See schematic view of FIG. 1N, showing arrows designating dopant implantations into one of the source/drain regions, it being understood that the other source/drain region is implanted similarly.

To complete an actual FinFET device, a conventional silicide step is performed as shown in FIG. 1O. Deposit Ni or Pt to form source/drain silicide, then remove metal from SiN (a conventional CMOS process step).

Figure 2A:
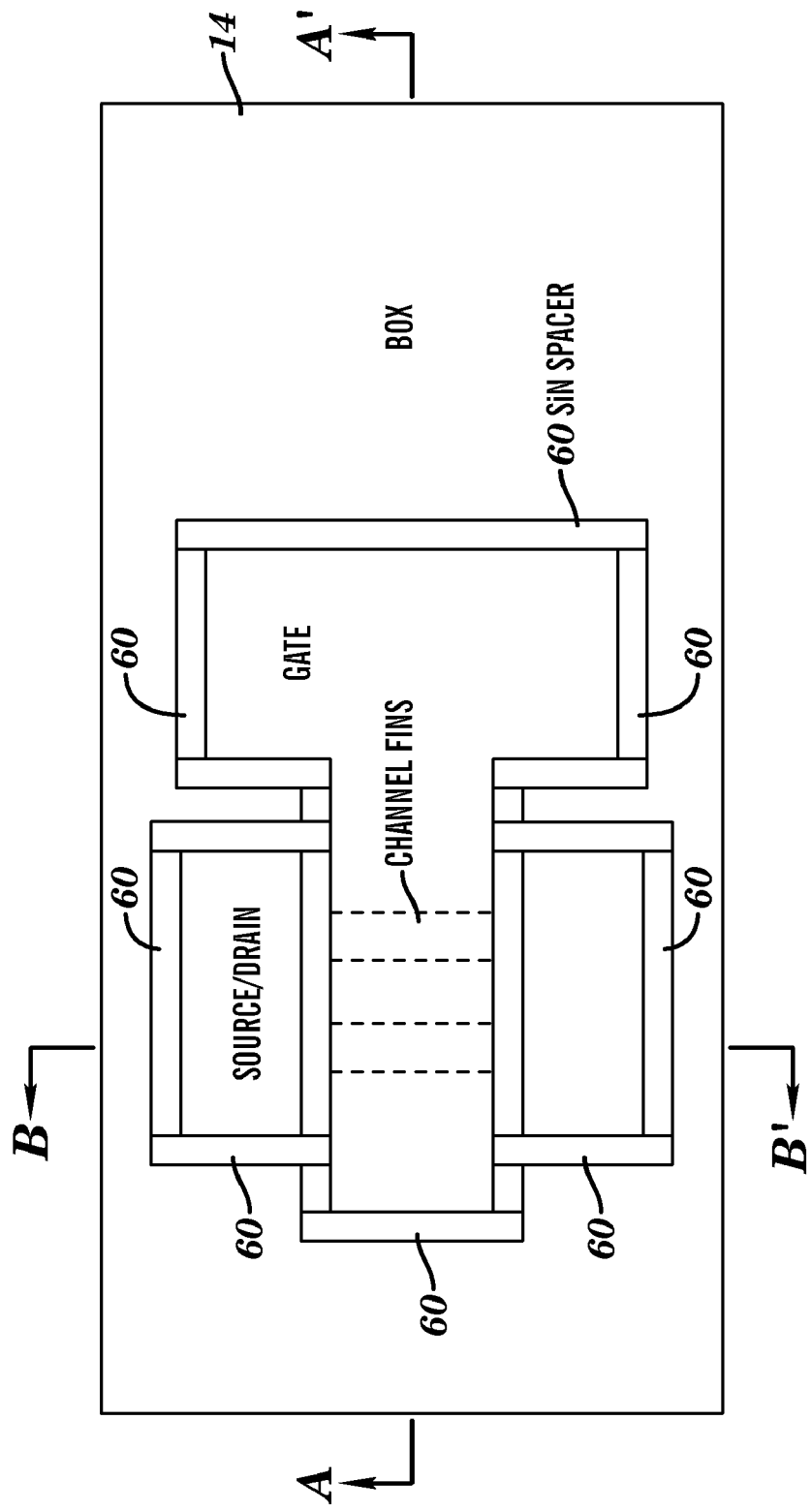
FIG. 2A, 2B, 2C show top planar, and side cross-sectional, schematic views of a final device/structure according to the preferred embodiment of FIGS. 1A-1O.
Figure 2B:
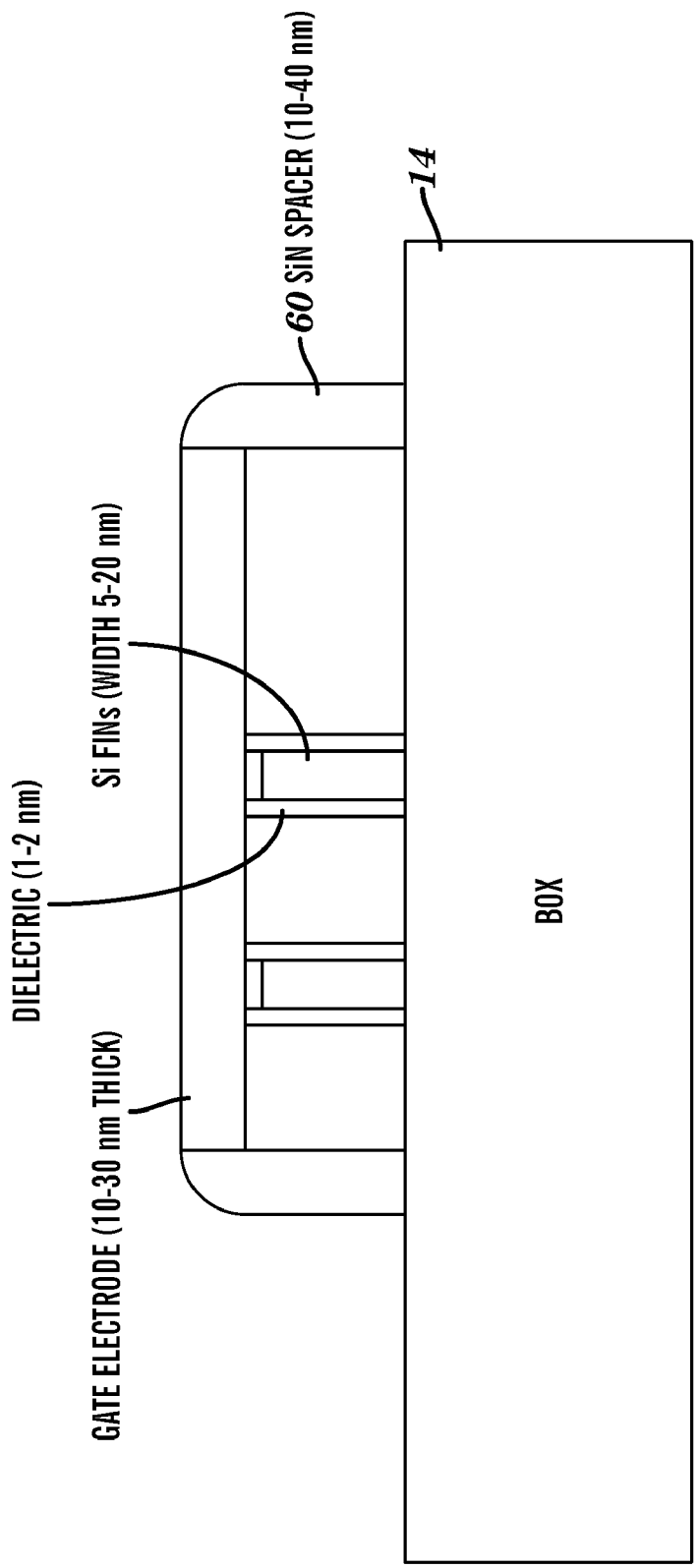
Figure 2C:
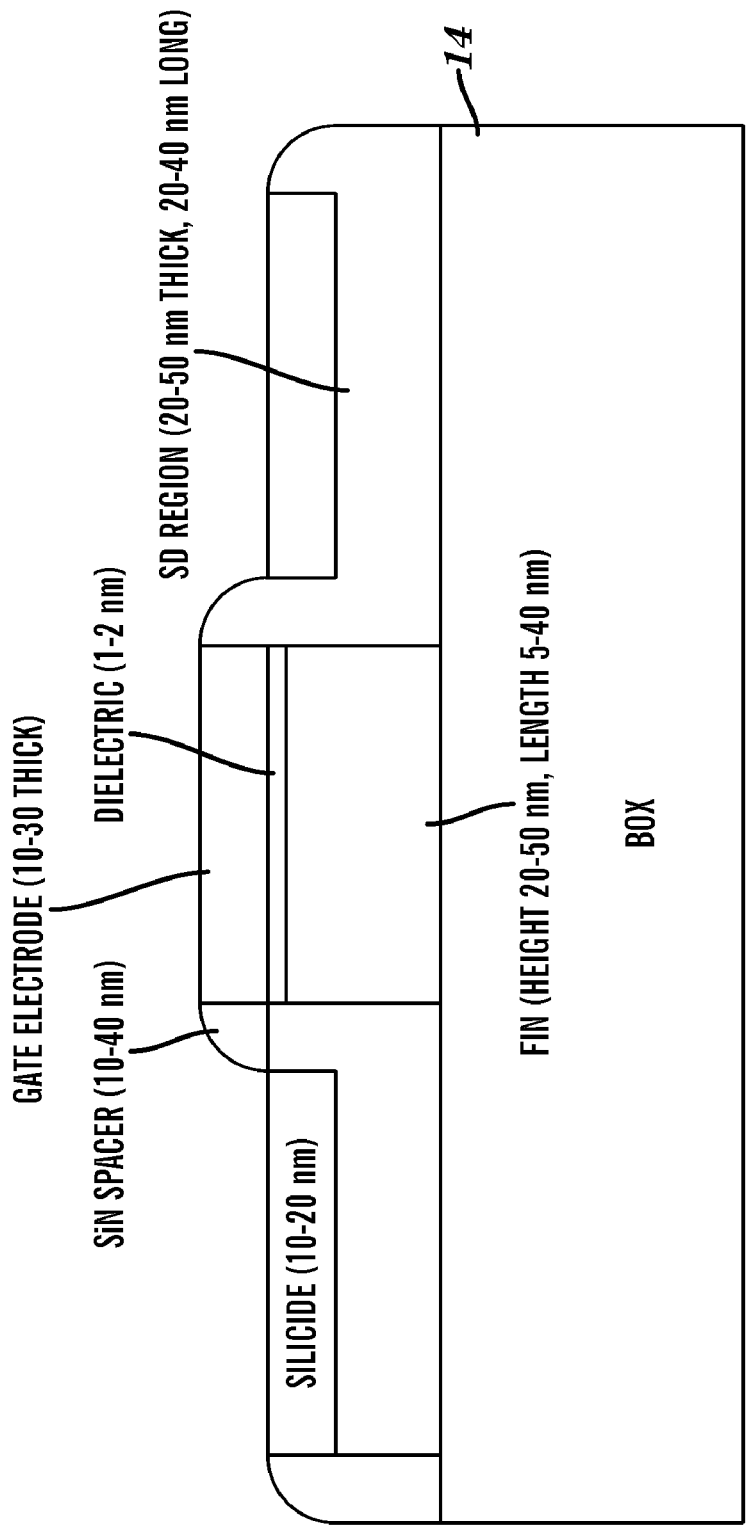

A completed FinFET device (tri gate) resulting from the inventive steps 1A-1O is shown in FIG. 2A (top view), and in cross sectional views AA' (FIG. 2B) and BB' (FIG. 2C).

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

In the preferred embodiment described and shown with respect to FIGS. 2A, 2B and 2C:

Gate electrode has a approximately uniform thickness in a range of about 10 nm to about 30 nm.

Each Si fin has a substantially uniform width of about 5 nm to about 20 nm.

Dielectric material 30 has an approximately uniform width of about 1 nm to about 2 nm.

Each SiN spacer has a width of about 10 nm to about 40 nm.

Each Si fin has an approximately uniform height of about 20 nm to about 50 nm, and a length of about 5 nm to about 40 nm.

Each silicide region has an approximately uniform thickness of about 10 nm to about 20 nm.

Each source/drain has an approximately uniform thickness of about 20 nm to about 50 nm, while each as an approximately uniform length of about 20 nm to about 40 nm.

What is claimed is:

1. A method for manufacturing a FinFET device, comprising:
   providing a substrate having a mask disposed thereon;
   covering portions of the mask to define a perimeter of a gate region;
   removing uncovered portions of the mask to expose the substrate;
   covering a part of the exposed substrate with another mask to define at least one fin region;
   forming the at least one fin and the gate region through both masks and the substrate, the gate region having side walls;
   disposing insulating layers around the at least one fin and onto the side walls;
   disposing a conductive material into the gate region and onto the insulating layers to form a gate electrode;
   covering parts of the mask adjacent to ends of the at least one fin, to define source and drain regions;
   removing uncovered parts of the mask;
   removing the remaining parts of the mask to produce an intermediate structure;
   disposing insulating spacers around perimeters of the intermediate structure, and then
   forming a source and a drain in the source and drain regions.

2. The method as claimed in claim 1, wherein the gate region is a T-shaped region.

3. The method as claimed in claim 1, wherein the mask is a hard mask.

4. The method as claimed in claim 3, further comprising planarizing the conductive material to be approximately coplanar with the hard mask.

5. The method as claimed in claim 1, wherein the mask consists essentially of Silicon Nitride ($S_3N_4$).

6. The method as claimed in claim 1, wherein said step of disposing a conductive material further comprises disposing the conductive material onto three surfaces of the at least one fin.

7. The method as claimed in claim 1, wherein the substrate is a semiconductor-on-insulator substrate.

8. The method as claimed in claim 1, wherein the substrate comprises silicon.

9. The method as claimed in claim 1, wherein the insulating layers consist essentially of high-k dielectric layers.

10. The method as claimed in claim 1, wherein the conductive material comprises a material selected from the group consisting of TaN, and TiN.

11. The method as claimed in claim 1, wherein each of the insulating layers comprise a material selected from the group consisting of Silicon Oxynitride (SiON), oxides of silicon, Silicon Nitride ($Si_3N_4$), Hafnium Dioxide ($HfO_2$), Zirconium Dioxide ($ZrO_2$), Aluminum Oxide ($Al_2O_3$), and Hafnium Silicate ($HfSiO_4$).

12. The method as claimed in claim 1, wherein the another mask is a photoresist mask.

13. The method as claimed in claim 1, further comprising forming the source and the drain by implanting dopants into the source and drain regions.

14. The method as claimed in claim 13, further comprising forming the insulating spacers around external perimeters of the source and drain regions and the gate region.

15. A method for making a FinFET device, comprising:
   providing a silicon-on-insulator substrate having a hard mask disposed over the silicon-on-insulator substrate;
   covering portions of the hard mask with a photoresist material to define a perimeter of a gate region;
   removing uncovered portions of the hard mask to expose the silicon on the insulator;
   covering a part of the silicon on the insulator to define at least one fin;
   forming the gate region and the at least one fin in the gate region through the silicon on the insulator, the gate region having silicon side walls;
   forming insulating layers on the at least one fin and the silicon side walls;
   disposing a conductive material into the gate region and onto the insulating layers;
   covering parts of the hard mask adjacent to ends of the at least one fin, to define source and drain regions;
   removing uncovered parts of the hard mask and the silicon on the insulator;
   removing the remaining parts of the hard mask to produce an intermediate structure;
   disposing insulating spacers around perimeters of the intermediate structure, and forming a source and a drain in the source and drain regions.

16. The method as claimed in claim 15, further comprising forming silicides in parts of the source and drain regions.

17. The method as claimed in claim 15, further comprising planarizing the conductive material.

18. The method as claimed in claim 15, further comprising chemically mechanically polishing the conductive material to be substantially planar with the hard mask.

19. The method as claimed in claim 15, wherein said step of forming the source and the drain comprising implanting dopants into the source and drain regions.

* * * * *